(12) United States Patent
Zhang et al.

(10) Patent No.: US 10,388,671 B2
(45) Date of Patent: Aug. 20, 2019

(54) ORGANIC LIGHT EMITTING DIODE ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Can Zhang, Beijing (CN); Shengji Yang, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/745,574

(22) PCT Filed: Jun. 29, 2017

(86) PCT No.: PCT/CN2017/090685
§ 371 (c)(1),
(2) Date: Jan. 17, 2018

(87) PCT Pub. No.: WO2018/086358
PCT Pub. Date: May 17, 2018

(65) Prior Publication Data
US 2019/0013336 A1    Jan. 10, 2019

(30) Foreign Application Priority Data
Nov. 11, 2016  (CN) .......................... 2016 1 0995313

(51) Int. Cl.
*H01L 27/12* (2006.01)
*H01L 51/52* (2006.01)
(Continued)

(52) U.S. Cl.
CPC ........ *H01L 27/1225* (2013.01); *H01L 27/127* (2013.01); *H01L 27/1259* (2013.01);
(Continued)

(58) Field of Classification Search
CPC ............... H01L 27/1225; H01L 27/127; H01L 51/5072; H01L 51/5056; H01L 51/5206;
(Continued)

(56) References Cited

U.S. PATENT DOCUMENTS 5,528,102 A    6/1996  Gnade et al.
6,191,433 B1 * 2/2001  Roitman ............. H01L 27/3281
                                                                257/40
(Continued)

FOREIGN PATENT DOCUMENTS

CN    1305641 A    7/2001
CN    1717139 A    1/2006
(Continued)

OTHER PUBLICATIONS

International Search Report of PCT/CN2017/090685 in Chinese, dated Sep. 30, 2017 with English translation.
(Continued)

*Primary Examiner* — Karen Kusumakar
*Assistant Examiner* — Adam S Bowen
(74) *Attorney, Agent, or Firm* — Collard & Roe, P.C.

(57) ABSTRACT

An organic light emitting diode array substrate, a manufacturing method thereof, and a display device are provided. The organic light emitting diode array substrate includes a base substrate; a first electrode pattern and an insulating layer disposed on the base substrate, wherein the first electrode pattern includes a plurality of first electrodes of strip shape, the first electrodes protrude above the insulating layer to form a step therebetween; an anti-oxidant conductive film disposed on the first electrode pattern and the insulating layer, wherein the anti-oxidant conductive film is disconnected at the step between the first electrodes and the insulating layer.

20 Claims, 5 Drawing Sheets

(51) Int. Cl.
*H01L 27/32* (2006.01)
*H01L 51/50* (2006.01)
*H01L 51/56* (2006.01)

(52) U.S. Cl.
CPC .......... *H01L 27/32* (2013.01); *H01L 27/3244* (2013.01); *H01L 51/50* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5253* (2013.01); *H01L 51/56* (2013.01)

(58) Field of Classification Search
CPC ............. H01L 51/5092; H01L 27/3244; H01L 51/5221; H01L 51/5012
USPC .......................................................... 257/40
See application file for complete search history.

(56) References Cited

U.S. PATENT DOCUMENTS

| | | | |
|---|---|---|---|
| 2004/0212298 A1 | 10/2004 | Guenther | |
| 2005/0275345 A1 | 12/2005 | Kim et al. | |
| 2006/0220537 A1 | 10/2006 | Takeshita et al. | |
| 2007/0063636 A1 | 3/2007 | Guenther et al. | |
| 2014/0138660 A1* | 5/2014 | Kugler | H01L 51/5088 257/40 |
| 2015/0380467 A1 | 12/2015 | Su | |

FOREIGN PATENT DOCUMENTS

| | | |
|---|---|---|
| CN | 1842925 A | 10/2006 |
| CN | 101989613 A | 3/2011 |
| CN | 104252276 A | 12/2014 |
| CN | 106024836 A | 10/2016 |
| CN | 106450019 A | 2/2017 |
| KR | 10-2011-0118293 A | 10/2011 |

OTHER PUBLICATIONS

Notice of Transmittal of the International Search Report of PCT/CN2017/090685 in Chinese, dated Sep. 30, 2017.
Written Opinion of the International Searching Authority of PCT/CN2017/090685 in Chinese, dated Sep. 30, 2017 with English translation.
Chinese Office Action in Chinese Application No. 201610995313.4, dated Nov. 3, 2017 with English translation.

* cited by examiner

US 10,388,671 B2

ORGANIC LIGHT EMITTING DIODE ARRAY SUBSTRATE, MANUFACTURING METHOD THEREOF AND DISPLAY DEVICE

CROSS REFERENCE TO RELATED APPLICATIONS

This application is the National Stage of PCT/CN2017/090685 filed on Jun. 29, 2017, which claims priority under 35 U.S.C. § 119 of Chinese Application No. 201610995313.4 filed on Nov. 11, 2016, the disclosure of which is incorporated by reference.

TECHNICAL FIELD

At least one embodiment of the present disclosure relates to an organic light emitting diode array substrate and a manufacturing method thereof, a display device.

BACKGROUND

Organic light emitting diode (OLED) display has a series of features such as self-luminescence, direct current driving with low voltage, being solid, wide viewing angle, light weight, capability of manufacturing large size and bendable panels, and simple process, and has low cost potential, and can meet requirements of today's information technology era on display technology of higher performance and greater information capacity. OLED micro-displays refer to organic light emitting devices (include structures such as anodes, organic light emitting layers and cathodes etc.) whose display size is less than 1 inch and based on silicon-based CMOS (complementary metal oxide semiconductor) drive, the pixel resolution can be up to 800×600 or more, thus the OLED micro-displays have been one of the hot spots in the present research field of VR/AR. Compared with the liquid crystal displays, the OLED has advantages such as low energy consumption, low production cost, self-luminescence, wide viewing angle and rapid response speed.

Currently, the OLED has begun to replace the traditional LCD display in the display field of smart glasses, head-mounted display (HMD) and night vision and the like; however, the production yield of the OLED micro-displays is still not high; for example, the electrode micro-oxidation of silicon wafer can lead to uneven distribution of the charge carriers injected into the OLED devices, thus can lead to uneven luminescence and dark spots of organic light emitting diode array.

SUMMARY

At least one embodiment of the present disclosure provides an organic light emitting diode array substrate, comprising: a base substrate; a first electrode pattern and an insulating layer disposed on the base substrate, wherein the first electrode pattern includes a plurality of first electrodes of strip shape, the first electrodes are configured to protrude above the insulating layer to form a step between the first electrodes and the insulating layer; an anti-oxidant conductive film disposed on the first electrode pattern and the insulating layer, wherein the anti-oxidant conductive film is disconnected at the step between the first electrodes and the insulating layer.

For example, in the OLED array substrate provided in at least one embodiment of the present disclosure, adjacent ones of the first electrodes are separated from each other by the insulating layer.

For example, in the OLED array substrate provided in at least one embodiment of the present disclosure, a height difference between the first electrodes and the insulating layer is greater than a thickness of the anti-oxidant conductive film in a direction perpendicular to a plane where the base substrate is located.

For example, in the OLED array substrate provided in at least one embodiment of the present disclosure, the height difference between the first electrodes and the insulating layer is greater than 400 Å.

For example, in the OLED array substrate provided in at least one embodiment of the present disclosure, the thickness of the anti-oxidant conductive film is in a range of 15~45 Å.

For example, the OLED array substrate provided in at least one embodiment of the present disclosure further comprises an organic light emitting layer and a second electrode on the anti-oxidant conductive film.

For example, in the OLED array substrate provided in at least one embodiment of the present disclosure, the anti-oxidant conductive film has an oxidation resistance greater than that of the first electrode pattern.

For example, in the OLED array substrate provided in at least one embodiment of the present disclosure, the material of the anti-oxidant conductive film includes at least one elected from the group consisting of gold, silver, copper, zinc, chromium and their alloys and conductive oxide.

For example, in the OLED array substrate provided in at least one embodiment of the present disclosure, the base substrate includes silicon wafer, silicon on insulator substrate or glass substrate.

For example, in the OLED array substrate provided in at least one embodiment of the present disclosure, a cross-sectional shape of each of the first electrodes taken along a direction perpendicular to the base substrate includes at least one of rectangular, inverted trapezoid or parallelogram.

At least one embodiment of the present disclosure provides a display device, comprising the OLED array substrate according to any one of the above embodiments.

At least one embodiment of the present disclosure provides a method for manufacturing an OLED array substrate, comprising: providing a base substrate; forming a first electrode pattern and an insulating layer on the base substrate, wherein the first electrode pattern includes a plurality of first electrodes of strip shape, the first electrodes protrude above the insulating layer to form a step between the first electrodes and the insulating layer; forming an anti-oxidant conductive film on the first electrode pattern and the insulating layer, wherein the anti-oxidant conductive film is disconnected at the step between the first electrodes and the insulating layer.

For example, in the method for manufacturing the OLED array substrate provided in at least one embodiment of the present disclosure, adjacent ones of the first electrodes are separated from each other by the insulating layer.

For example, the method for manufacturing the OLED array substrate provided in at least one embodiment of the present disclosure further comprises: forming an organic light emitting layer and a second electrode on the anti-oxidant conductive film.

For example, in the method for manufacturing the OLED array substrate provided in at least one embodiment of the present disclosure, a height difference between the first electrodes and the insulating layer is greater than 400 Å.

For example, in the method for manufacturing the OLED array substrate provided in at least one embodiment of the present disclosure, the thickness of the anti-oxidant conductive film is in a range of 15~45 Å.

For example, in the method for manufacturing the OLED array substrate provided in at least one embodiment of the present disclosure, the anti-oxidant conductive film is formed by thermal evaporation.

For example, in the method for manufacturing the OLED array substrate provided in at least one embodiment of the present disclosure, an angle between a direction of the thermal evaporation and the base substrate is an acute angle.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
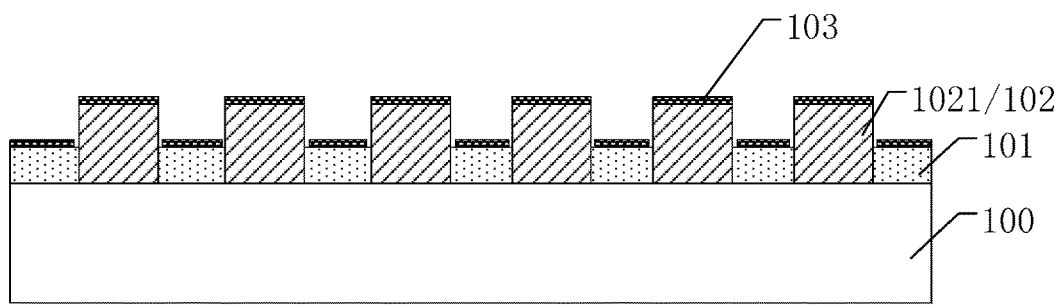
FIG. 1 is a schematic structural view of an OLED array substrate provided by one embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a related manufacturing process of an OLED array substrate, for example, after forming an electrode on a silicon wafer and before forming an organic light emitting layer, the electrode's surface is easy to be micro-oxidized, which can lead to poor performance of the electrical contact, uneven distribution of the charge carriers (electron or hole) injected into the organic light emitting devices which are finally formed in the OLED array substrate, and dark spots phenomenon caused by uneven luminescence of the corresponding pixel regions.

It should be noted that an organic light emitting device provided in at least one embodiment of the present disclosure can include multilayer structures such as a first electrode, an organic light emitting layer and a second electrode, wherein the first electrode is an anode and the second electrode is a cathode, or the first electrode is a cathode and the second electrode is an anode. The organic light emitting device can further comprise such as functional layers such as a hole injection layer, a hole transport layer, an electron injection layer and an electron transport layer.

At least one embodiment of the present disclosure provides an OLED array substrate and a manufacturing method thereof, a display device. The OLED array substrate comprises a base substrate, a first electrode pattern and an insulating layer disposed on the base substrate, an anti-oxidant conductive film disposed on the first electrode pattern and the insulating layer, wherein the first electrode pattern includes a plurality of first electrodes of strip shape, the first electrodes protrude above the insulating layer to form a step between the first electrodes and the insulating layer. The first electrode pattern includes a plurality of first electrodes, and adjacent ones of the first electrodes are separated from each other by the insulating layer.

In the OLED array substrate, the anti-oxidant conductive film is formed on the first electrode pattern so as to avoid the problems of the charge carriers' uneven distribution caused by the local micro-oxidization of the first electrodes included in the first electrode pattern. Furthermore, the first electrodes protrude above the insulating layer to form a step between the first electrodes and the insulating layer, thus when forming the anti-oxidant conductive film, the anti-oxidant conductive film is disconnected at the step, and the process such as lithography process for processing is not required.

It should be noted that when describing the location, materials, forming methods and the like of the first electrodes, the meaning expressed by the first electrode pattern instead of the first electrodes is the same, for example the micro-oxidation on the surface of the first electrode pattern described in the embodiments is the same with the micro-oxidation on the surface of the first electrodes; for another instance, the insulating layer wrapping the first electrode pattern is equivalent to that the insulating layer wraps the first electrodes.

In some embodiments, the anti-oxidant conductive film covers the first electrode pattern, if the first electrode pattern is made from easily oxidized materials, for example, when the first electrode pattern serves as the cathode of the organic light emitting device, it is possible to prevent the surface of the first electrode pattern which can be oxidized easily from being oxidized or partially oxidized to result in a decrease in conductivity, and improve the electrical contact status with the organic light emitting layer subsequently formed on the first electrode pattern; in addition, in some embodiments, the anti-oxidant conductive film can also make the injected charge carriers (electrons or holes) be evenly distributed on the anti-oxidant conductive film corresponded with the first electrode pattern in the finally formed organic light emitting device, and can improve the uneven injection problem of the charge carriers. In addition, during the process of forming the anti-oxidant conductive film, a step structure exists between the first electrodes included in the first electrode pattern and the insulating layer, the anti-oxidant conductive film is automatically disconnected at the step and does not need a following process such as lithography process.

Hereinafter, the OLED array substrate and the manufacturing method thereof, the display device according to the embodiments of the present disclosure will be described in detail with reference to the accompanying drawings.

At least one embodiment of the present disclosure provides an OLED array substrate. FIG. 1 is a schematic structural view of the OLED array substrate. For example, as illustrated in FIG. 1, the OLED array substrate comprises a base substrate 100, a first electrode pattern 102 and an insulating layer 101 disposed on the base substrate 100, an anti-oxidant conductive film 103 disposed on the first electrode pattern 102 and the insulating layer 101, a plurality of striped first electrodes 1021 included in the first electrode pattern 102 protrude above the insulating layer 101 to form a step therebetween. Although the first electrodes 1021 of the first electrode pattern 102 is embedded in the insulating layer 101 as illustrated in FIG. 1, it can be understood that the first electrode pattern 102 can also be formed on the insulating layer 101, so that the first electrodes 1021 protrudes above the insulating layer 101 to form the step therebetween.

As illustrated in FIG. 1, the insulating layer 101 wraps the first electrode pattern 102 during its forming process, and a small steep slope is formed at the position where the first electrodes 1021 included in the first electrode pattern 102 contacts with the insulating layer 101 in their circumferential direction. During the process of forming the anti-oxidant conductive film 103, for example, by thermal evaporation, the steep slope prevents the anti-oxidant conductive film 103 formed on the insulating layer from being electrically connected with the first electrode pattern 102 due to small thickness of the anti-oxidant conductive film 103. Thus, adjacent ones of the first electrodes 1021 of the first electrode patterns 102 cannot be connected through the anti-oxidant conductive film 103 and short-circuited.

For example, in the OLED array substrate provided in at least one embodiment of the present disclosure, adjacent ones of the first electrodes 1021 are separated from each other by the insulating layer 101.

For example, in the OLED array substrate provided in at least one embodiment of the present disclosure, the height difference between the first electrodes 1021 included in the first electrode pattern 102 and the insulating layer 101 is greater than the thickness of the formed anti-oxidant conductive film 103, preferably significantly greater than the thickness of the anti-oxidant conductive film 103, for example, the height difference can be greater than 400 Å. The present disclosure includes but not limits this.

For example, in the OLED array substrate provided in at least one embodiment of the present disclosure, the thickness of the anti-oxidant conductive film 103 can be in a range from 15 to 45 Å. The present disclosure includes but not limits this.

For example, in the OLED array substrate provided in at least one embodiment of the present disclosure, the material of the anti-oxidant conductive film 103 includes at least one selected from the group consisting of gold, silver, copper, zinc, chromium and the like, their alloys, and a conductive oxide material. For example, the material is more difficult to be oxidized and lead its conductivity to be decreased relative to the metal material used for forming the first electrode pattern (for example, magnesium or magnesium alloy). For example, the conductive oxide material can include indium tin oxide (ITO), indium gallium zinc oxide (IGZO) or the like.

For example, in the OLED array substrate provided in at least one embodiment of the present disclosure, for example, the substrate 100 can be a silicon wafer or a silicon-on-insulator (SOI) substrate, a glass substrate or the like.

Figure 2:
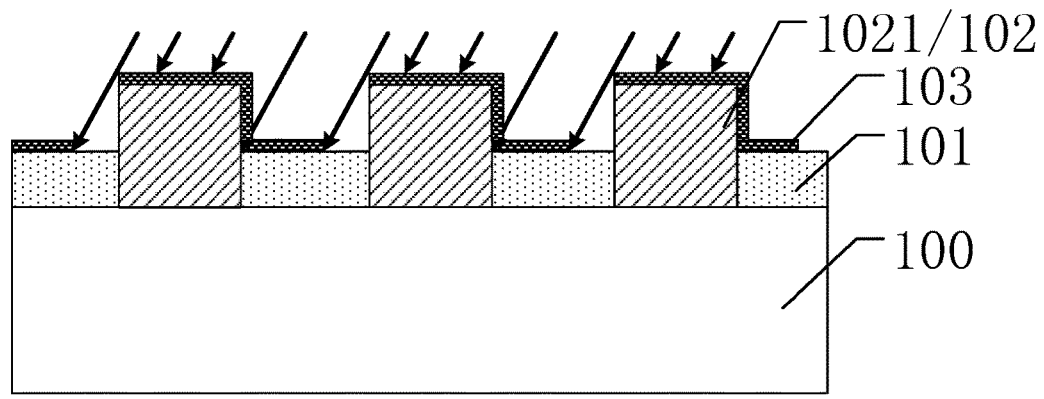
FIG. 2 is a schematic view illustrating a thermal evaporation process of an OLED array substrate provided by one embodiment of the present disclosure.

At least one embodiment of the present disclosure provides an OLED array substrate, and FIG. 2 is a schematic view illustrating a thermal evaporation process of the OLED array substrate. For example, as illustrated in FIG. 2, during forming the anti-oxidant conductive film 103 by the thermal evaporation, an angle between the direction of the thermal evaporation and the substrate 100 can be an acute angle. In the thermal evaporation process, because the height difference between the electrodes 1021 included in the first electrode pattern 102 and the insulating layer 101 makes the first electrode pattern 102 to obstruct the portion of the anti-oxidant conductive film 103 being formed on the insulating layer 101, one end of each of the two ends of the anti-oxidant conductive film 103 formed on the insulating layer 101 contacts with the first electrode pattern 102 and the other end is disconnected from the first electrode pattern 102. Therefore, adjacent ones of the electrodes of the first electrode pattern 102 are not connected with each other via the anti-oxidant conductive film 103 and short circuit is avoided.

Figure 3:
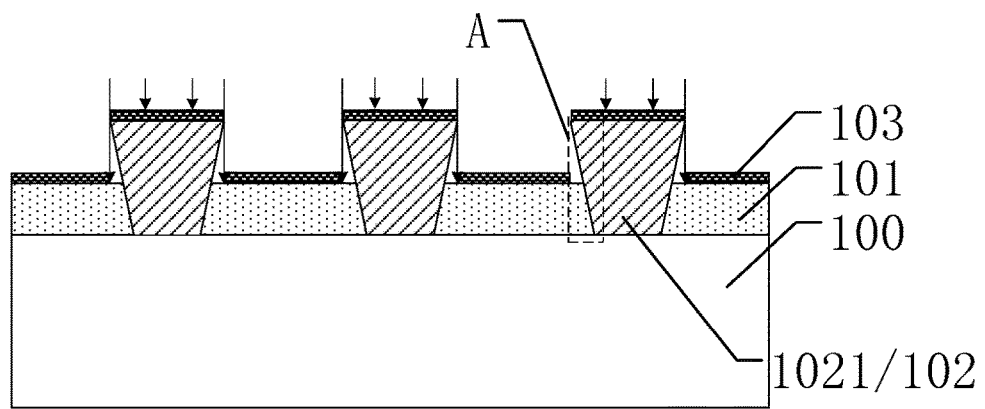
FIG. 3 is a schematic structural view of an OLED array substrate provided by another embodiment of the present disclosure.

At least one embodiment of the present disclosure provides an OLED array substrate, and FIG. 3 is another schematic structural view of the OLED array substrate. For example, as illustrated in FIG. 3, the first electrode pattern 102 includes a plurality of strip-shaped first electrodes 1021, a vertical cross-section (a cross-sectional shape taken along a direction perpendicular to a panel where the base substrate 100 is located) of the first electrodes 1021 is in a shape of inverted trapezoid, and the cross-sectional shape has a larger width at the side away from the substrate 100 than at the side close to the substrate 100. During forming the anti-oxidant conductive film 103 by the thermal evaporation, the bottom edge of the first electrode pattern 102 with trapezoidal structure away from the bottom of the substrate 100 shields the portion of the insulating layer 101 around the first electrodes 1021, thus, the anti-oxidant conductive film 103 formed on the insulating layer 101 is disconnected with the first electrodes 1021 on the periphery thereof.

It should be noted that, in the embodiments of the present disclosure, the shape of the vertical cross-section of the first electrodes included in the first electrode pattern in the organic light emitting diode array substrate is not limited to be the inverted trapezoidal structure abovementioned, as long as at least one side surface of the first electrodes is formed with an undercut structure, the anti-oxidant conductive film formed by thermal evaporation is disconnected from the at least one adjacent electrode of the first electrode pattern, thus, the adjacent electrodes in the first electrode pattern are not be connected and short-circuited. The shape of the cross-sectional shape of the first electrodes 1021 having the undercut structure in a direction perpendicular to the substrate 100 can further includes a parallelogram, a right-angled trapezoid, and the like, all the first electrode patterns 102 having the undercut shape on the sides can obtain the same technique effect. The inverted trapezoidal structure of the above embodiments allows the undercut structure to be formed on both sides of the formed first electrode pattern 102.

Region A is an undercut structure formed on one side surface of the first electrodes 1021 included in the first electrode pattern 102 as illustrated in FIG. 3. An angle between the side surface and the portion not in contact with the first electrodes 1021 in a plane where the insulating layer 101 is located (or a plane where the substrate 100 is located) is an acute angle, thus, on the side where the undercut structure of the first electrodes 1021 is formed, one end of the side surface of the first electrodes 1021 can extend beyond another end thereof in contact with the insulating layer 101 so as to shield a portion (the insulating layer 101 around the first electrodes 1021) of the insulating layer 101, thus when forming the anti-oxidant conductive film 103 by the thermal evaporation, the anti-oxidant conductive film 103 cannot be formed in the shielded portion, which can prevent the adjacent first electrodes 1021 being short circuited.

For example, in at least one embodiment of the present disclosure, the undercut structure is formed on the side surface of each of the first electrodes in the same direction, or the undercut structure is formed on both side surfaces of each of the first electrodes.

Figure 4:
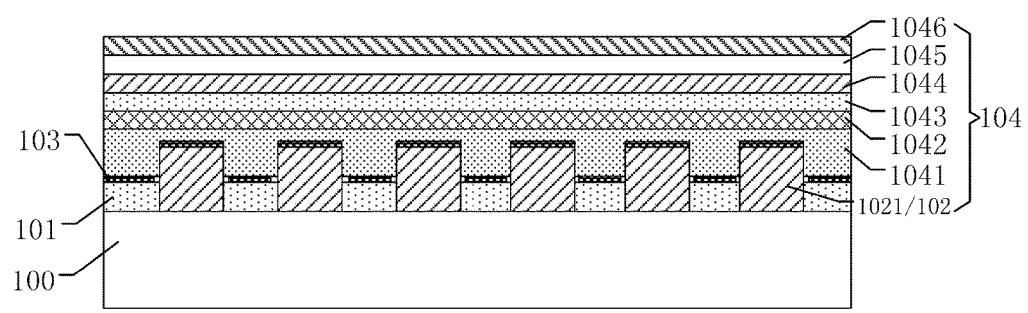
FIG. 4 is a schematic structural view of an OLED array substrate provided by another embodiment of the present disclosure.
Figure 5:
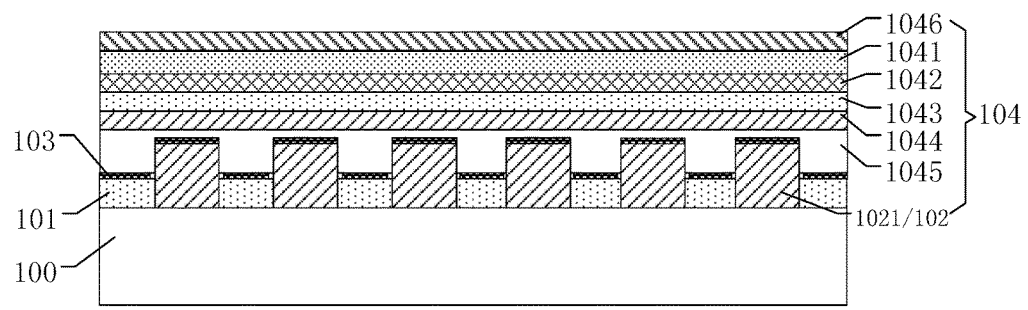
FIG. 5 is a schematic structural view of an OLED array substrate provided by another embodiment of the present disclosure.

At least one embodiment of the present disclosure provides an OLED array substrate, and FIG. 4 is a schematic structural view of the OLED array substrate in another embodiment of the present disclosure. As illustrated in FIG. 4, the organic light emitting diode array substrate includes other partial structures in the organic light emitting device 104 disposed on the anti-oxidant conductive film 103 except the first electrodes 1021. For example, in the case that the first electrode pattern 102 serves as a cathode, besides the first electrodes 1021, the organic light emitting device 104 can further includes an electron injection layer 1041, an electron transport layer 1042, an organic light emitting layer 1043, a hole transport layer 1044, a hole injection layer 1045 and a second electrode 1046 (anode) sequentially disposed on the anti-oxidant conductive film 103. It should be understood that the most basic organic light emitting device includes a lamination of an anode, an organic light emitting layer and a cathode; in order to improve the light emitting performance of the organic light emitting device, a hole injection layer, a hole transport layer, an electron transport layer, an electron injection layer and other organic functional layers can be selectively added into the organic light emitting device. In order to easily explaining the technical solutions in the embodiments of the present disclosure, taking a case that the first electrode pattern is mainly used as the cathode of the organic light emitting device and the second electrode is used as the anode of the organic light emitting device as an example to explain the technical solutions in the following embodiments of the present disclosure.

In at least one embodiment of the present disclosure, the first electrodes 1021 included in the first electrode pattern 102 in the organic light emitting diode array substrate is not limited to being embedded in the insulating layer, and can be disposed on the insulating layer 101 and forms a step with the insulating layer.

The OLED array substrate provided by at least one embodiment of the present disclosure is not limited to being applied on the silicon wafer, the structure that the first electrodes 1021 protrudes above the insulating layer 101 for forming a step therebetween is also can be applied on the organic light emitting diode array substrate that forming the OLED (organic light emitting diode) on a glass substrate. With this structure, the anti-oxidant conductive film formed on the electrode can be automatically disconnected between adjacent electrodes while covering the corresponding electrodes, the subsequent process such as lithography process is not required, and the yield of the organic light emitting diode array substrate is improved while reducing the process steps and reducing the cost.

At least one embodiment of the present disclosure provides a display device, and the display device includes the OLED array substrate provided in the above embodiments. For example, the display device can be a cell phone, a tablet, a television, a monitor, a notebook computer, a digital camera, a navigator and any other products or components with display capabilities.

At least one embodiment of the present disclosure provides a method for manufacturing an OLED array substrate. For example, the method for manufacturing the OLED array substrate comprises: providing a base substrate; forming a first electrode pattern and an insulating layer on the base substrate, wherein the first electrode pattern includes a plurality of first electrodes of strip shape, the first electrodes protrude above the insulating layer to form a step between the first electrodes and the insulating layer; forming an anti-oxidant conductive film on the first electrode pattern and the insulating layer, wherein the anti-oxidant conductive film is disconnected at the step between the first electrodes and the insulating layer. It should be noted that for the specific structure of the organic light emitting diode array substrate made by the above method can refer to the related content of the above-mentioned embodiments (referring to the embodiments of the organic light emitting diode array substrate), which will not be repeated herein.

For example, in the method for manufacturing the OLED array substrate provided in at least one embodiment of the present disclosure, adjacent ones of the first electrodes are separated from each other by the insulating layer.

For example, the method for manufacturing the OLED array substrate provided in at least one embodiment of the present disclosure can further comprise: forming other partial structures of the organic light emitting device except the first electrodes on the anti-oxidant conductive film, comprising forming an organic light emitting layer and a second electrode and the like. For example, the first electrode pattern is a cathode (corresponding to that the first electrode is a cathode), and the process of forming other partial structures of the organic light emitting device except the first electrodes comprises: sequentially forming an organic light emitting layer and a second electrode on the first electrode pattern of the organic light emitting diode array substrate whose surface is covered by the anti-oxidant conductive film, or for example, sequentially forming an electron injection layer, an electron transport layer, an organic light emitting layer, a hole transport layer, a hole injection layer and the second electrode.

In order to facilitate the explanation of the technical solutions in the embodiments of the present disclosure, the method of manufacturing the OLED array substrate is described by reference to one example of the embodiments of the present disclosure. FIGS. 6a~6j are schematic views illustrating a manufacturing process of the OLED array substrate in one embodiment of the present disclosure. Referring to FIGS. 6a~6j, the manufacturing process of forming the organic light emitting diode array substrate provided by an instance of the embodiment of the present disclosure can include the following steps.

Figure 6A:
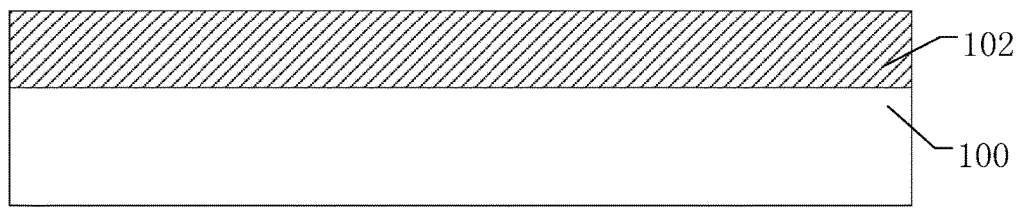
FIGS. 6a~6j are schematic views illustrating a manufacturing process of an OLED array substrate provided by one embodiment of the present disclosure.

As illustrated in FIG. 6a, providing a substrate 100 and depositing a first electrode film on the substrate 100.

Figure 6B:
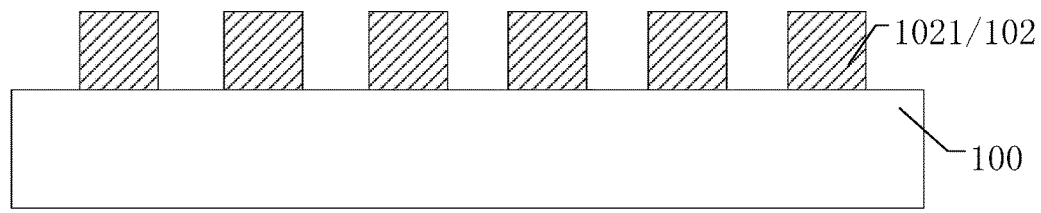

As illustrated in FIG. 6b, patterning the first electrode film on the substrate 100 by a patterning process to form a first electrode pattern 102, the first electrode pattern 102 includes a plurality of strip-shaped first electrodes 1021.

For example, the patterning process can be a photolithography patterning process and comprises: coating a photoresist layer on a structure layer needed to be patterned, exposing the photoresist layer using a mask, developing the exposed photoresist layer to obtain a photoresist pattern, etching the structure layer by the photoresist pattern, and then selectively removing the photoresist pattern.

Figure 6C:
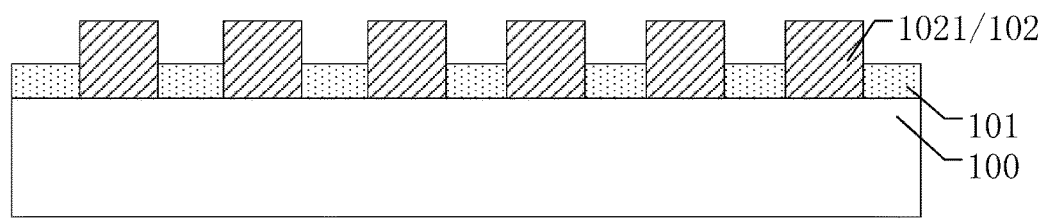

As illustrated in FIG. 6c, forming an insulating layer 101 on the substrate 100 on which the first electrode patterns 102 are formed, wherein the first electrodes 1021 included in the first electrode patterns 102 protrude from the insulating layer 101 to form the step. During the process of forming the insulating layer 101, the insulating layer 101 wraps the periphery of the first electrode pattern 102 and forms small steep slopes at the position where the first electrodes 1021 of the first electrode pattern 102 contacts with the insulating layer 101.

The insulating layer separates the first electrodes, and the forming sequence of the first electrode pattern and the insulating layer can be reversed. For example, forming the insulating layer on the substrate, then depositing the first electrode film on the insulating layer, and patterning the first electrode film to form the first electrode pattern.

Figure 6D:
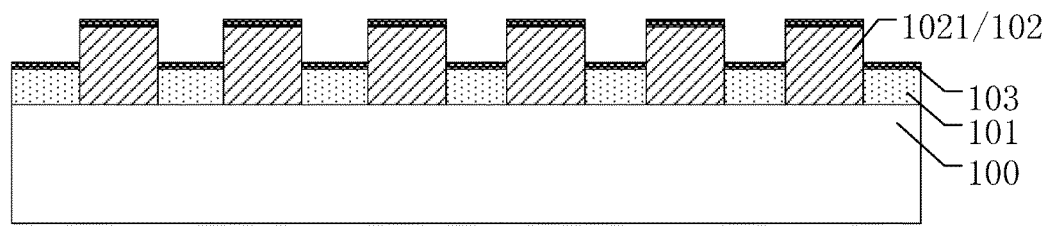

As illustrated in FIG. 6d, forming an anti-oxidant conductive film 103 on the first electrode pattern 102 and the insulating layer 101. Due to the step structure formed between the first electrodes 1021 included in the first electrode pattern 102 and the insulating layer 101, the anti-oxidant conductive film 103 is discontinuous at the step. Because of the small steep slope at the position where the first electrodes 1021 included in the first electrode pattern 102 contacts with the insulating layer 101, and the small thickness of the anti-oxidant conductive film 103, the formed anti-oxidant conductive film 103 does not contact with the first electrodes 1021 included in the first electrode pattern 102. That is to say, the steep slope will prevent the anti-oxidant conductive film 103 formed on the insulating layer from being electrically connecting with the adjacent first electrodes 1021, thus the adjacent first electrodes 1021 between the first electrode patterns 102 are not short-circuited via the connection of the anti-oxidant conductive film 103.

For example, the anti-oxidant conductive film 103 is formed by thermal evaporation. For example, by introducing a strong electric field, the material which is used for thermal evaporation is made to carry electric charges, then these charged material molecules or particles is enabled to fly out and fly to the substrate accurately by heating under the control of the electromagnetic field, then the anti-oxidant conductive film is formed on the substrate on which the first electrode pattern and the insulating layer are formed.

For example, in the manufacturing process of the OLED array substrate of the present disclosure, the thickness of the formed anti-oxidant conductive film is in a range of 15~45 Å.

For example, in the manufacturing process of the organic light emitting diode array substrate of the present embodiment, a height difference between the first electrodes 1021 included in the first electrode pattern 102 and the insulating layer 101 is greater than the thickness of the anti-oxidant conductive film 103, preferably significantly greater than the thickness of the anti-oxidant conductive film 103, for example, the height difference between two of them can be greater than 400 Å.

For example, in the manufacturing process of the organic light emitting diode array substrate of the present embodiment, the material for manufacturing the anti-oxidant conductive film 103 includes at least one selected from the group consisting of gold, silver, copper, zinc, chromium, their alloys, and conductive oxides. For example, the conductive oxide material can be indium tin oxide (ITO), indium gallium zinc oxide (IGZO), or the like.

For example, in the manufacturing method according to the embodiments of the present disclosure, in the process of forming the anti-oxidant conductive film, for example, by the thermal evaporation, the angle between a direction of the thermal evaporation and the base substrate is an acute angle. In the process of the thermal evaporation, due to the fact that the first electrode pattern protrudes above the insulating layer and the angle between a direction of the thermal evaporation and the base substrate is an acute angle, the first electrode pattern 102 can shield a portion of the anti-oxidant conductive film 103 formed on the insulating layer 101, that is, at the shielded position, the anti-oxidant conductive film and the electrodes of the first electrode pattern are disconnected, thereby ensuring that the adjacent electrodes 1021 of the first electrode pattern cannot connect with each other through the anti-oxidant conductive film.

For example, in the manufacturing process of the organic light emitting diode array substrate of the present embodiment, at least one side surface of each of the first electrodes 1021 is formed with an undercut structure. When one side surface of each of the first electrodes 1021 has an undercut structure, at the position of this side surface, for example, when the direction of thermal evaporation is perpendicular to the substrate, for example, a part of the insulating layer in the vertical direction is shielded by the side surface, the anti-oxidant conductive film cannot be formed in this shielded region, that is, the anti-oxidant conductive film is disconnected from at least one of the adjacent electrodes included in the first electrode pattern, thereby ensuring that the adjacent first electrodes 1021 included in the first electrode pattern cannot be connected by the anti-oxidant conductive film.

After forming the anti-oxidant conductive film, forming other partial structures of the organic light emitting device (not illustrated in the figure) except the first electrodes on the anti-oxidant conductive film, for example, comprising a hole injection layer, a hole transport layer, an organic light emitting layer, an electron transport layer, an electron injection layer and a second electrode. When the first electrode pattern is used as a cathode, the manufacturing process of the organic light emitting device is as illustrated in FIGS. 6e-6j.

Figure 6E:
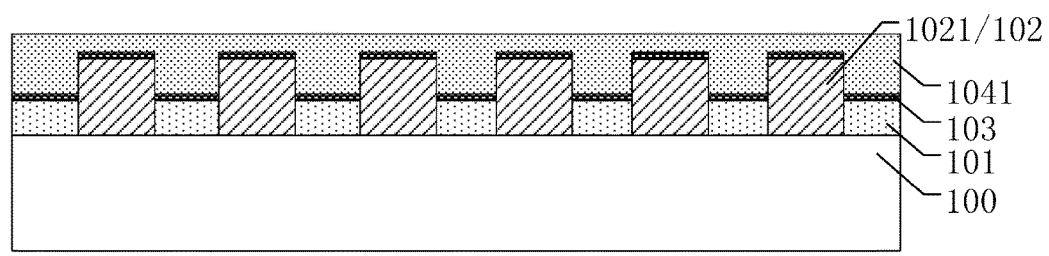

As illustrated in FIG. 6e, forming an electron injection layer film on the anti-oxidant conductive film 103, and providing a patterning process for it to form the electron injection layer 1041.

Materials for manufacturing the electron injection layer include lithium fluoride, lithium oxide, lithium boron oxide, potassium silicate, cesium carbonate, aluminum 8-hydroxyquinoline-lithium and the like.

Figure 6F:
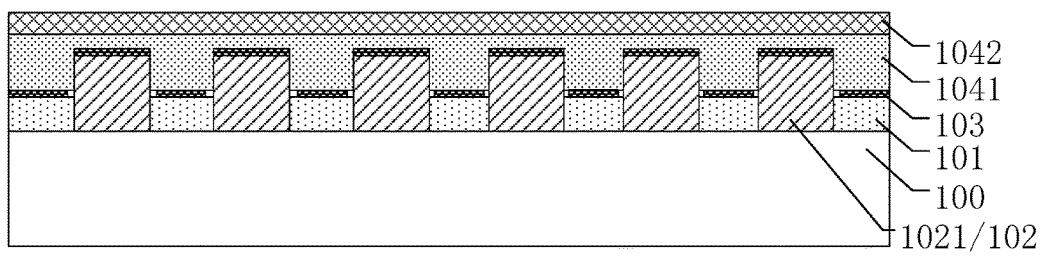

As illustrated in FIG. 6f, forming an electron transport layer on the electron injection layer 1041, and providing a patterning process for it to form the electron transport layer 1042.

Materials for manufacturing the electron transporting layer include oxazole derivatives, metal chelates, azoles, quinoline derivatives, oxaline derivatives, diazenium derivatives, silicon-containing heterocyclic derivatives and the like.

Figure 6G:
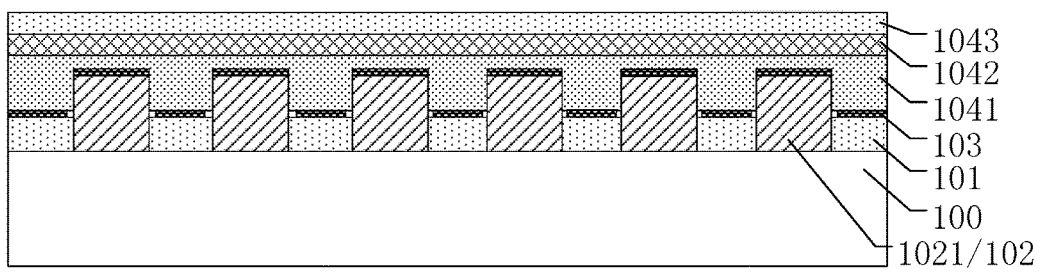

As illustrated in FIG. 6g, forming an organic light emitting layer film on the electron transport layer 1042. For example, forming the organic light emitting layer 1043 by an evaporation mask.

Materials for manufacturing the organic light emitting layer include aluminum 8-hydroxyquinoline, aluminum 8-hydroxyquinoline, derivatives of anthracene and the like, and choosing the corresponding organic light emitting materials according to requirement, the embodiments of the present disclosure are not limited to these choices of the specific material.

Figure 6H:
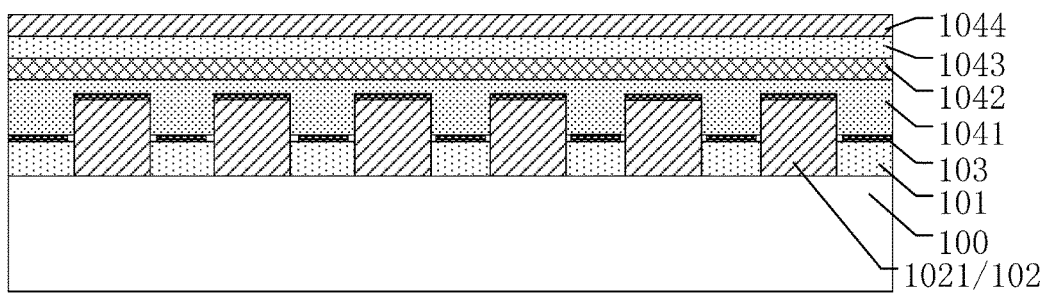

As illustrated in FIG. 6h, forming a hole transport layer film on the organic light emitting layer 1043 and providing a patterning process for it to form the hole transport layer 1044.

Materials for manufacturing the hole transport layer include polyparaphenylene vinylene, polythiophenes, polysilanes, triphenylmethanes, triarylamines, hydrazones, pyrazolines, oxazolines, carbazoles, butadienes and the like.

Figure 6I:
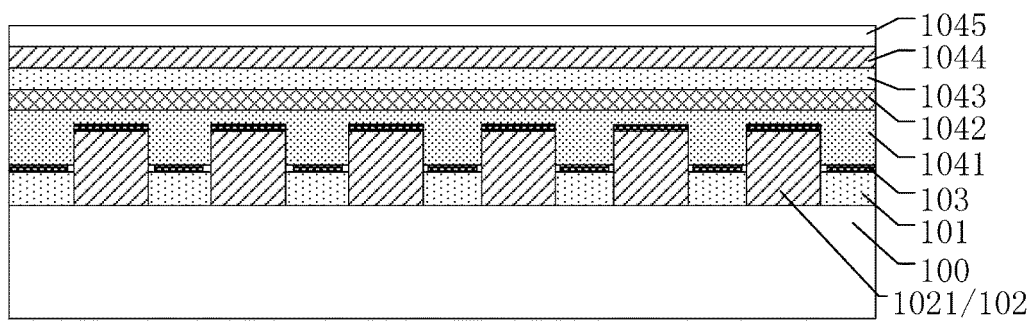

As illustrated in FIG. 6i, forming a hole injection layer film on the hole transport layer 1044 and providing a patterning process for it to form the hole injection layer 1045.

Materials for manufacturing the hole injection layer include copper phthalocyanine, molybdenum trioxide, 1-TNATA, 2-TNATA, polyaniline, PEDOT (polymer of 3,4-ethylenedioxythiophene monomer) and the like.

Figure 6J:
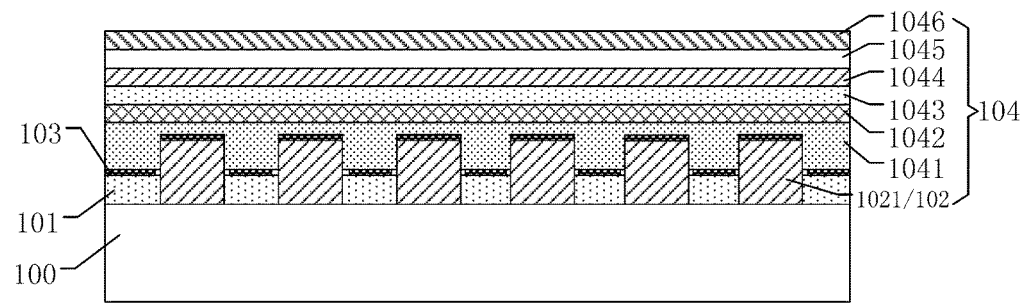

As illustrated in FIG. 6j, forming a second electrode film on the hole injection layer 1045, and providing a patterning process for it to form the second electrode 1046.

The manufacturing method of each layer structure (such as the hole injection layer, the hole transport layer, the organic light emitting layer and the like) in the organic light emitting device is not limited to its patterning process after the thin films of the respective layers are formed, it can also be, for example, forming a pixel defining layer on the substrate on which the anti-oxidant conductive film has been formed, a groove defined by the pixel defining layer corresponding to the position of the pixel electrode, and sequentially forming layers of components included in the organic light emitting device on the anti-oxidant conductive film in the groove defined by the pixel defining layer.

When the first electrode pattern 102 is an anode (corresponding to the anode of the first electrodes 1021), the manufacturing process of each layer structure on the anti-oxidant conductive film included in the organic light emitting device is reverse with the manufacturing process of the above FIGS. 6e~6i, i.e., sequentially forming the hole injection layer, the hole transport layer, the organic light emitting layer, the electron transport layer, the electron injection layer, and the second electrode on the first electrode pattern.

The first electrode pattern and the second electrode can be an anode and a cathode with respect to each other. The material for manufacturing the anode includes any one of metallic aluminum and conductive oxides (such as ITO, IGZO) and the like, the materials for manufacturing the cathode include any one of metallic potassium, lithium, calcium, magnesium, indium or magnesium aluminum alloy, magnesium silver alloy, lithium aluminum alloy.

The formation of the organic light emitting device in the above embodiments is not limited to only form at least one of the first electrodes, the hole injection layer, the hole transport layer, the organic light emitting layer, the electron transport layer, the electron injection layer and the second electrode, it can also form a complete organic light emitting device on the first electrode pattern, for example, sequentially forming a cathode, an organic light emitting layer and an anode, or sequentially forming a structure of an anode, an organic light emitting layer and a cathode. The organic light emitting device can further include a hole injection layer, a hole transport layer, an organic light emitting layer, an electron transport layer, an electron injection layer and the like, these functional layers are sequentially arranged according to specific structure.

The embodiments of the present disclosure provide an organic light emitting diode array substrate and a manufacturing method thereof, a display device, and have at least one of the following beneficial effects:

(1) At least one embodiment of the present disclosure provides an OLED array substrate, wherein an anti-oxidant conductive film is formed on the surface on which a first electrode pattern and a insulating layer are formed, thereby the problem that the charge carriers injected into the formed organic light emitting device is unevenly distributed caused by the local micro-oxidization of the first electrodes included in the first electrode pattern is avoided, uniformity and yield of the light emitted from the light emitting diode array substrate are improved.

(2) In at least one embodiment of the present disclosure, the first electrodes protrude above the insulating layer to form a step between two of them, so that the anti-oxidant conductive film is disconnected at the step when forming the anti-oxidant conductive film and it is not necessary to be processed by subsequent processes such as photolithography, which reduces the production process of manufacturing the anti-oxidant conductive film.

For the present disclosure, the following points should be noted:

(1) The accompanying drawings in the embodiments of the present disclosure only involve structures relevant to the embodiments of the present disclosure, and other structures may refer to the conventional design.

(2) For clarity, in the accompanying drawings of the embodiments of the present disclosure, the thickness of layers or regions is enlarged or reduced. That is, the accompanying drawings are not drawn according to actual scales.

(3) The embodiments of the present disclosure and the characteristics in the embodiments may be mutually combined without conflict.

The described above are only specific embodiments of the present disclosure, and the present disclosure is not limited thereto. The scope of the present disclosure is defined by the claims.

The application claims priority of the Chinese patent application No. 201610995313.4, filed on Nov. 11, 2016, the disclosure of which is incorporated herein by reference as part of the application.

What is claimed is:

1. An organic light emitting diode (OLED) array substrate, comprising:
   a base substrate;
   a first electrode pattern and an insulating layer disposed on the base substrate, wherein the first electrode pattern includes a plurality of first electrodes separated from each other, the first electrodes are configured to protrude above the insulating layer to form a step between the first electrodes and the insulating layer;
   an anti-oxidant conductive film disposed on the first electrode pattern and the insulating layer, wherein the anti-oxidant conductive film includes a first portion on the first electrode pattern and a second portion on the insulating layer, the first portion is disconnected from the second portion, and the anti-oxidant conductive film has an oxidation resistance greater than that of the first electrode pattern.

2. The OLED array substrate according to claim 1, wherein the first electrodes are separated from each other by the insulating layer.

3. The OLED array substrate according to claim 1, wherein a height difference between the first electrodes and the insulating layer is greater than a thickness of the anti-oxidant conductive film in a direction perpendicular to a plane where the base substrate is located.

4. The OLED array substrate according to claim 1, wherein the height difference between the first electrodes and the insulating layer is greater than 400 Å.

5. The OLED array substrate according to claim 1, wherein the thickness of the anti-oxidant conductive film is in a range of 15~45 Å.

6. The OLED array substrate according to claim 1, further comprising an organic light emitting layer and a second electrode on the anti-oxidant conductive film.

7. The OLED array substrate according to claim 1, wherein a material of the anti-oxidant conductive film includes at least one selected from the group consisting of gold, silver, copper, zinc, chromium, their alloys and conductive oxides.

8. The OLED array substrate according to claim 1, wherein the base substrate includes silicon wafer, silicon on insulator substrate or glass substrate.

9. The OLED array substrate according to claim 1, wherein a cross-sectional shape of each of the first electrodes taken along a direction perpendicular to the base substrate includes at least one of rectangular, inverted trapezoid or parallelogram.

10. A display device, comprising the OLED array substrate according to claim 1.

11. The display device according to claim 10, further comprising: an electron injection layer, an electron transport layer, an organic light emitting layer, a hole transport layer, a hole injection layer and a second electrode sequentially disposed on the anti-oxidant conductive film in a direction away from the anti-oxidant conductive film.

12. The OLED array substrate according to claim 1, wherein a material of the plurality of first electrodes includes at least one selected from the group consisting of magnesium and magnesium alloy.

13. The OLED array substrate according to claim 1, wherein the anti-oxidant conductive film includes a first portion on a surface of the first electrode pattern away from the base substrate and a second portion on a side surface of the first electrode pattern.

14. A method for manufacturing an organic light emitting diode (OLED) array substrate, comprising:
  providing a base substrate;
  forming a first electrode pattern and an insulating layer on the base substrate, wherein the first electrode pattern includes a plurality of first electrodes separated from each other, the first electrodes protrude above the insulating layer to form a step between the first electrodes and the insulating layer;
  forming an anti-oxidant conductive film on the first electrode pattern and the insulating layer, wherein the anti-oxidant conductive film is formed into a first portion on the first electrode pattern and a second portion on the insulating layer, and the first portion is disconnected from the second portion, and the anti-oxidant conductive film has an oxidation resistance greater than that of the first electrode pattern.

15. The method for manufacturing the OLED array substrate according to claim 14, wherein adjacent ones of the first electrodes are separated from each other by the insulating layer.

16. The method for manufacturing the OLED array substrate according to claim 14, further comprising forming an organic light emitting layer and a second electrode on the anti-oxidant conductive film.

17. The method for manufacturing the OLED array substrate according to claim 14, wherein a height difference between the first electrodes and the insulating layer is greater than 400 Å.

18. The method for manufacturing the OLED array substrate according to claim 14, wherein a thickness of the anti-oxidant conductive film is in a range of 15~45 Å.

19. The method for manufacturing the OLED array substrate according to claim 14, wherein the anti-oxidant conductive film is formed by thermal evaporation.

20. The method for manufacturing the OLED array substrate according to claim 19, wherein an angle between a direction of the thermal evaporation and the base substrate is an acute angle.

* * * * *